US011960754B2

(12) United States Patent
Kamaraj et al.

(10) Patent No.: US 11,960,754 B2
(45) Date of Patent: Apr. 16, 2024

(54) MEMORY SUB-SYSTEM MEMORY BANK SEARCH COMPONENT

(71) Applicant: Micron Technology, Inc., Boise, ID (US)

(72) Inventors: Revanth Kamaraj, Secunderabad (IN); Brian Toronyi, Boulder, CO (US); Balwinder Pal Sethi, Distt. Moga (IN); Trapti Jain, Indore (IN); Madhu, Danapur Cantt (IN); Chandrakanth Rapalli, Jeedimetla Village (IN)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 17/412,830

(22) Filed: Aug. 26, 2021

(65) Prior Publication Data
US 2022/0206707 A1    Jun. 30, 2022

Related U.S. Application Data

(60) Provisional application No. 63/132,178, filed on Dec. 30, 2020.

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
USPC ....................................................... 711/154
See application file for complete search history.

(56) References Cited

U.S. PATENT DOCUMENTS

| | | | | |
|---|---|---|---|---|
| 6,240,485 B1* | 5/2001 | Srinivasan | ............. | G11C 15/04 |
| | | | | 711/108 |
| 6,590,511 B2* | 7/2003 | Hayashi | ................. | G11C 15/00 |
| | | | | 341/51 |
| 7,987,205 B1* | 7/2011 | Depelteau | ........... | G06F 16/2246 |
| | | | | 707/802 |
| 8,266,501 B2 | 9/2012 | Jeddeloh | | |
| 10,372,366 B2 | 8/2019 | Bennett | | |
| 10,761,766 B2 | 9/2020 | Bennett | | |
| 11,074,973 B2* | 7/2021 | Akerib | ................. | G11C 15/046 |
| 11,500,887 B2* | 11/2022 | Dongaonkar | ....... | G06F 16/2462 |
| 2008/0028138 A1* | 1/2008 | Cypher | ............... | G06F 12/0607 |
| | | | | 711/108 |
| 2008/0307181 A1* | 12/2008 | Kuszmaul | ........... | G06F 16/2246 |
| | | | | 711/E12.001 |

(Continued)

*Primary Examiner* — Yaima Rigol
*Assistant Examiner* — Elias Young Kim
(74) *Attorney, Agent, or Firm* — Brooks, Cameron & Huebsch, PLLC

(57) ABSTRACT

A logical array having a plurality of memory banks is constructed, wherein each of the plurality of memory banks is split into a plurality of slots. A plurality of elements corresponding to a plurality of data components are stored in the plurality of slots of each of the plurality of memory banks of the logical array. The location of a data component stored in the memory component is determined by locating elements stored in a particular slot of the plurality of slots; and performing a corrective search on the located elements in the particular slot to locate a particular element. The data component is accessed based on the location of the particular element.

17 Claims, 4 Drawing Sheets

(56) References Cited

U.S. PATENT DOCUMENTS

| | | | |
|---|---|---|---|
| 2014/0136764 A1* | 5/2014 | Li | G11C 16/0483 |
| | | | 711/103 |
| 2014/0297929 A1* | 10/2014 | Nellans | G06F 13/426 |
| | | | 711/103 |
| 2019/0206460 A1* | 7/2019 | O | G11C 7/1045 |
| 2019/0220230 A1* | 7/2019 | Khan | G06F 12/0207 |
| 2019/0221276 A1* | 7/2019 | Chih | G11C 16/3459 |
| 2019/0235780 A1* | 8/2019 | DeBenedictis | G06F 3/0604 |
| 2020/0026446 A1* | 1/2020 | Jawahar | G06F 3/065 |

* cited by examiner

MEMORY SUB-SYSTEM MEMORY BANK SEARCH COMPONENT

PRIORITY INFORMATION

This application claims benefit of U.S. Provisional Application No. 63/132,178, filed Dec. 30, 2020, the contents of which are herein incorporated by reference.

TECHNICAL FIELD

Embodiments of the disclosure relate generally to memory sub-systems, and more specifically, relate to a memory sub-system memory bank search component.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to a memory sub-system memory bank search component. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A conventional memory sub-system can utilize traditional binary search methods to search for (e.g., find) data stored in the memory sub-system. A traditional binary search can search for data in a sorted list. For instance, the traditional method of searching for data can include repeatedly dividing the list in half until the possible location of the data is narrowed. However, traditional binary search methods can increase the time used to search and locate data stored in the memory sub-system, which can decrease the performance of the memory sub-system.

To increase the performance (e.g., reduce the search time) of the memory sub-system, conventional methods may use multi data ports to stripe the data across the different data ports. However, doing so may increase the cost and/or complexity of the memory sub-system and/or decrease the storage space available in the memory sub-system.

Aspects of the present disclosure address the above and other deficiencies by having a memory sub-system that utilizes a logical array including multiple single data ports to increase the search speed in the memory sub-system. In many instances, the single data ports of the memory sub-system can include multiple storage spaces within a particular single data port by splitting the single data port into slots and storing elements of the logical array in the slots of the single data port. The components of the memory sub-system can perform a parallel search of the slots to quickly locate data in the memory sub-system. Accordingly, the memory sub-system can quickly access data components stored in the memory sub-system without causing data replication, which can reduce the cost and/or complexity of the memory sub-system, and/or increase the amount of storage space available in the memory sub-system.

Figure 1:
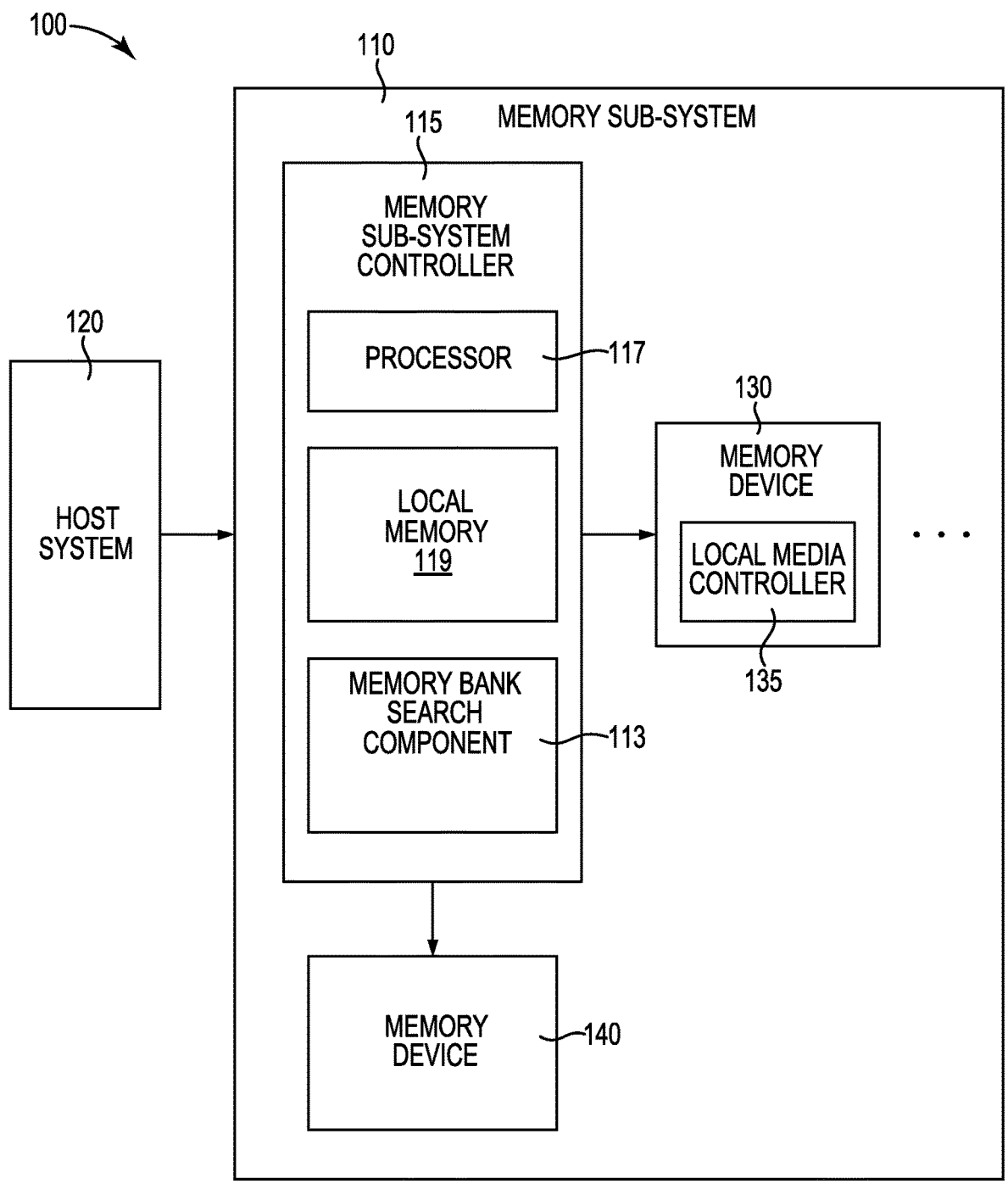
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA)

interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells. The memory cells can include single level cells (SLCs) that can store one bit per cell, multi-level cells (MLCs) that can store two bits per cell, triple level cells (TLCs) that can store three bits per cell, quad-level cells (QLCs) that can store four bits per cell, and/or penta-level cells (PLCs) that can store five bits per cell, among others. As used herein, the term multiple level cells is used to refer to cells configured to store more than one bit per cell (e.g., MLC, TLC, QLC, PLC, etc.). In some embodiments, a particular memory component can include an SLC portion, and an MLC portion, a TLC portion, a QLC portion, and/or a PLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

The memory sub-system 110 includes a memory bank search component 113 that can store elements (e.g., indices) corresponding to data in memory banks of a logical array. In some embodiments, the memory sub-system controller 115 includes at least a portion of the memory bank search component 113. For example, the memory sub-system controller 115 can include a processor 117 (processing device) configured to execute instructions stored in local memory 119 for performing the operations described herein. In some embodiments, the memory bank search component 113 is part of the host system 110, an application, or an operating system. In some embodiments, the memory bank search component 113 can be included in the local media controller 135 of memory device 130.

Memory bank search component 113 can construct a logical array including memory banks. The memory bank search component 113 can split each memory bank into slots to store an array of elements. In some embodiments, each element can include a key and a corresponding value. Each element can correspond to a data component stored in a memory device 130. The memory bank search component 113 can determine the location of a data component stored in memory device 130. For example, the memory bank search component 113 can locate the approximate location of elements stored in slots of memory banks. The elements can correspond to the data components stored in the memory device 130, which can provide the location of the data component. The memory bank search component 113 can perform a corrective search for the data component within the slots on the particular memory bank after the approximate location of the elements has been determined. Performing the corrective search on the approximate location of elements can provide the memory bank search component 113 the information needed to determine the location of the data component and access the data component stored at the memory device 130. Further details with regards to the operations of the memory bank search component 113 are described below.

For example, memory bank search component 113 can construct a logical array having a plurality of memory banks, wherein each of the memory banks can be split into slots. In some embodiments, each of the memory banks can be associated with a single data port. The single data port associated with each of the memory banks can include a small random-access memory (RAM). In some embodiments, the single data port associated with each of the memory banks can be one of three or more data ports of the memory sub-system 110. The memory bank search component 113 can also store, in the slots of each of the memory banks of the logical array, a plurality of elements corresponding to a plurality of data components in memory device 130. For instance, each different element can correspond to a different data component of memory device 130.

To determine a location of a data component stored in memory device 130, the memory bank search component 113 can locate elements stored in particular slots and perform a corrective search on the located elements in the slots of each of the memory banks to locate a particular element. In some embodiments, memory bank search component 113 can locate the particular element in one of the memory banks by processing each memory bank concurrently. Once the particular element is determined, the memory bank search component 113 can access the data component stored at the memory device 130.

In some embodiments, the memory banks of the logical array can be split into three or more slots (e.g., the slots can comprise three or more slots). Further, each slot can be separated into two or more rows, and each respective element can be stored in a different row. For instance, the elements can be stored in ascending or descending order based on the key of the element. However, this disclosure is not so limited. For example, in some embodiments, the elements can be stored in ascending order based on the key of the element. In some embodiments, the memory bank search component 113 can search each slot in parallel to locate the particular element. For instance, memory bank search component 113 can perform the corrective search by searching the rows of a particular slot in parallel to locate a particular element.

In some embodiments, the memory bank search component 113 can identify a particular element by locating the lowest numbered key in the memory banks. That is, two or more elements can be identified by locating the lowest numbered keys in the memory banks. For example, the memory bank search component 113 can identify elements associated with a data component by identifying a smallest numbered keys (e.g., the approximate location of the row) within the slots. If there are duplicates of the lowest numbered key, the memory bank search component 113 can return the key with the lowest index number. That is, the location of elements can be approximated by identifying rows of the memory bank. The memory bank search component 113, as described herein, can perform a corrective search to determine a particular element based on an identified row and access the data component stored at the memory device 130 based on the determined row. In some embodiments, performing the corrective search can include performing two or more sense operations (e.g., reads) on the slot in which the elements are located. For example, the corrective search can include performing two or more reads on rows of the memory banks to determine the particular element that is associated with a data component.

Figure 2:
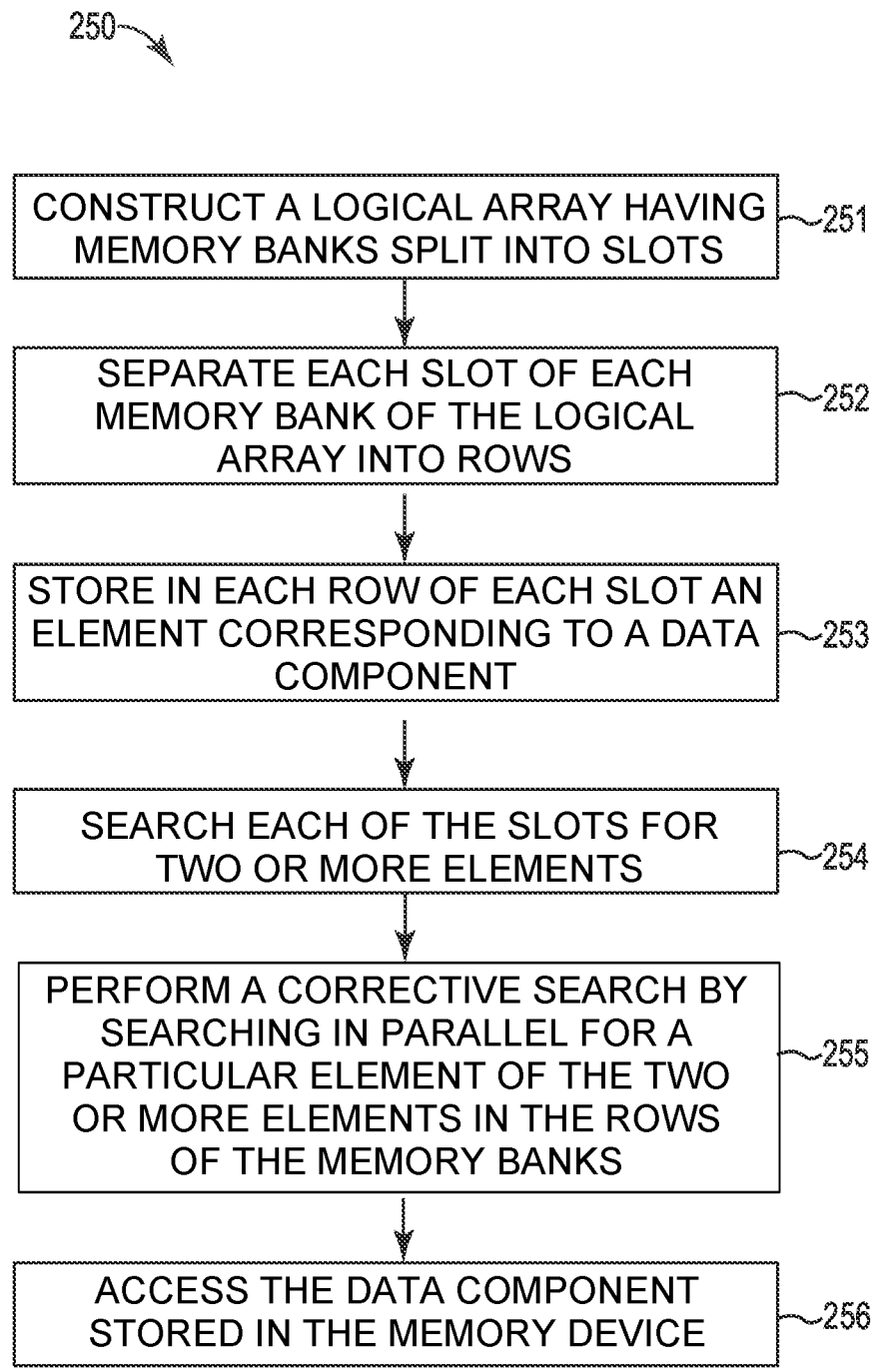
FIG. 2 is a flow diagram of an example method of operating a memory bank search component in accordance with some embodiments of the present disclosure.

FIG. 2 is a flow diagram of an example method 250 of operating a memory bank search component in accordance with some embodiments of the present disclosure. The method 250 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 250 is performed by the memory bank search component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 251, the processing device can construct a logical array having memory banks split into slots. The memory banks of the logical array can be used to store elements corresponding to data components stored in a memory device (e.g., memory device 130 of FIG. 1), as previously described herein. Each memory bank can be split to create multiple slots. In some embodiments, each memory bank can be split into three or more slots. The memory banks can be split into the same number of slots or different number of slots. For instance, in a non-limiting example, a first and second memory bank can be split into three slots. In another non-limiting example, a first memory bank can be split into three slots and a second memory bank can be split into four slots. The slots within each memory bank can be used to store information. For instance, each memory bank can store multiple groups of information that can be separately accessed.

At operation 252, the processing device can separate each slot of each memory bank of the logical array into rows. In some embodiments, the logical array can be fully striped across the memory banks. For example, the logical array can include three memory banks and can be fully striped across the three memory banks. The rows of the logical array can spread across memory banks of the logical array. In some embodiments, the elements can be accessed from any location in the row. In some embodiments, each slot can be separated into two or more rows. Each slot of a memory bank can be separated (e.g., divided) into rows to increase the storage space of each memory bank. For example, the memory bank can store multiple groups of information in a slot of a memory bank by storing each respective group of information in a different row, thereby increasing the amount of information that is stored in each slot of the memory bank, as compared to a memory bank that is not divided into slots and/or rows. Moreover, increasing the amount of information in a memory bank can reduce the number of memory banks that need to be searched to access a data component stored in the memory device, which can reduce the search time for the data component, as compared to a memory bank with a reduced amount of storage capability.

At operation 253, the processing device can store, in each row of each slot, an element corresponding to a data component stored in the memory device. As discussed herein, each row can be used to separately store information within a slot of the memory bank. For example, the processing device can store an element in each row. For instance, each slot may contain multiple rows where each row can contain an element. In some embodiments, the processing device can perform a faster search for the data component when elements corresponding to data components are stored in rows within the memory bank, as compared to memory banks that do not store elements in rows of memory banks. In some embodiments, the element can be stored in ascending order of the respective memory bank. In some embodiments, the element can be stored in ascending or descending order of the respective memory bank.

At operation 254, the processing device can search the slots of the memory banks for two or more elements. For instance, the processing device can search multiple slots in the memory banks to find the approximate location of a particular element. That is, the processing device can locate two or more elements to locate a particular element corresponding to a data component. In some embodiments, the processing device can locate the approximate location of a particular element faster by searching the memory banks in parallel (e.g., concurrently), as compared to searching the memory banks one at a time. In some embodiments, searching for two or more elements within the rows of a memory bank can reduce the number of elements searched when accessing data components. For instance, the processing device can limit and narrow the search for a particular element within a logical array to reduce the number of elements searched.

At operation 255, the processing device can perform a corrective search by searching in parallel for a particular element of the two or more elements in the rows of the memory banks. For instance, the processing device can search the rows of a slot, in parallel, to pinpoint the actual location of the particular element corresponding to a particular data component. That is, the corrective search can determine the actual location of the particular element, and therefore the corresponding data component, based on the approximate location of the two or more elements. For instance, the approximate location of the particular element can determine the memory bank, and/or slot a particular element is located, but may not determine the specific row in which the particular element is located. The processing device can perform two or more reads on the slot to perform the corrective search. For instance, the rows of the slots can be read two or more times to determine the particular element, and therefore the corresponding data component.

In some embodiments, the element can include a key and a corresponding value. The memory bank search component can search each element for the lowest numbered key to determine the approximate location of the two or more elements. For example, when the processing device is given a range of keys (e.g., [10,8]) a search through the rows can locate all the keys in the range (e.g., the keys that include ten (10), eight (8) and all the numbers in between). The processing device can choose the lowest key within the range to locate two or more elements and/or a particular element. If there are duplicates of the lowest key, then the processing device can choose the lowest key with the lowest array index to locate the element. The corresponding value to the lowest key of the particular element can provide the location of the data component in the memory device. That is, the processing device can use the element to determine the location of the data component in the memory device.

At operation 256 the processing device can access the data component stored in the memory device. That is, once the location of the data component is determined, the processing device can access the data component from the stored location.

Figure 3:
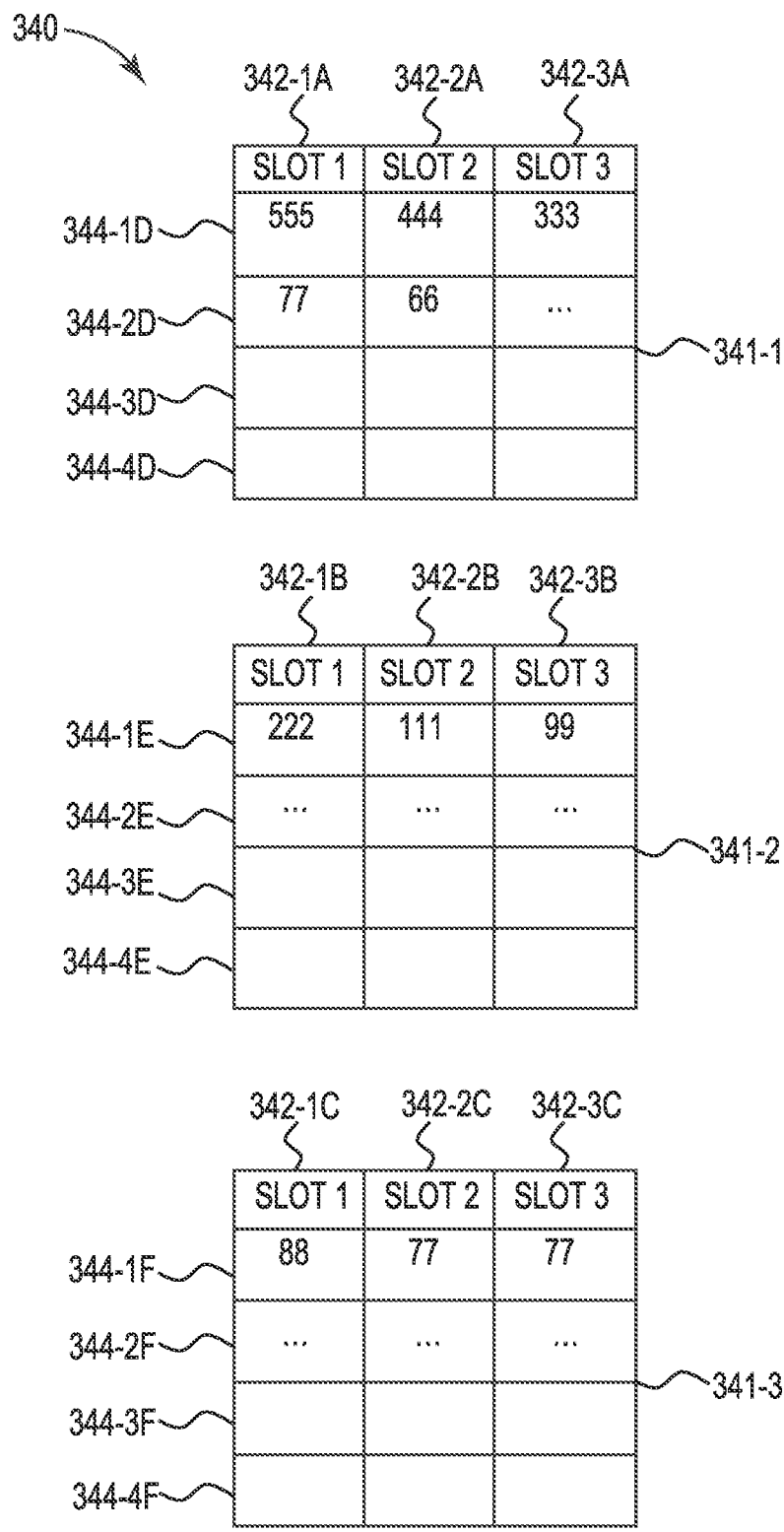
FIG. 3 illustrates an example of a logical array having a plurality of memory banks in accordance with some embodiments of the present disclosure.

FIG. 3 illustrates an example of a logical array 340 having a plurality of memory banks 341 in accordance with some embodiments of the present disclosure. The logical array 340 can be constructed by, for example, memory bank search component 113 of FIG. 1. In the example illustrated in FIG. 3, logical array 340 has been striped into three memory banks 341-1, 341-2, and 341-3 (e.g., memory banks 341-1, 341-2, and 341-3 can collectively be referred to as memory banks 341). However, this disclosure is not so limited. For example, the logical array can be striped into more or less memory banks. In some embodiments, each memory bank 341 has the capacity to store twelve (12) elements. For instance, the elements are striped across the logical array, storing twelve (12) elements in each memory bank 341-1, 341-2, 341-3.

In some embodiments, each memory bank 341 in the logical array can be split into three or more slots 342. For example, memory bank 341-1 can be split into slots 342-1A, 342-2A, and 342-3A; memory bank 341-2 can be split into slots 342-1B 32-2B, and 342-3B; and memory bank 341-3 can be split into slots 342-1C, 342-2C, and 342-3C (e.g., slots 342 can collectively refer to slots 342-1A, 342-2A, 342-3A, 342-1B, 342-2B, 342-3B, 342-1C, 342-2C, and 342-3C). Each slot 342 can store an element corresponding to a data component stored in a memory device (e.g., memory device 130 of FIG. 1). Memory bank search component 113 can search the slots 342 of the memory banks 341 for the elements.

In some embodiments, each memory bank 341 can be connected to a data port. For instance, the number of memory banks 341 can equal the number of data ports. The data port can be coupled to any slot of the memory bank 341 it is connected to. In addition, each memory bank 341 can include an address port. In some embodiments, each address port can be connected to a memory bank to receive and/or send elements to the rows 344 or each memory bank 341.

The slots 342 of the memory banks 341 can be separated into rows 344. For example, slots 342-1A, 342-2A, and 342-3A of memory bank 341-1 can each be separated into rows 344-1D, 344-2D, 344-3D, and 344-4D; slots 342-1B, 342-2B, and 342-3B of memory bank 341-2 can be separated into rows 344-1E, 344-2E, 344-3E, and 344-4E; and slots 342-1C, 342-2C, and 342-3C can be separated into rows 344-1F, 344-2F, 344-3F, and 344-4F (e.g., rows 344 can collectively refer to rows 344-1D, 344-2D, 344-3D, 344-4D, 344-1E, 344-2E, 344-3E, 342-4E, 344-1F, 344-2F, 344-3F, and 344-4F). In some embodiments, the processor can store an element in each row 344 of each slot 342 of the memory bank 341.

In some embodiments, the memory bank search component can search each memory bank (341-1, 341-2, and 341-3) for elements at the same time. For instance, the memory bank search component can search the slots 342 of each memory bank 341 at the same time for two or more elements. For example, the memory bank search component can search slots 342-1A, 342-2A, and 342-3A of memory bank 341-1, slots 342-1B, 342-2B, and 342-3B of memory bank 341-2, and slots 342-1C, 342-2C, and 342-3C of memory bank 341-3 to determine the approximate location of a particular element. The memory bank search component can determine the approximate locations of a particular element by locating two or more elements during the search of the memory banks 341, and these approximate locations of elements can be stored in a queue. As used herein, the term "queue" refers to a location to store information.

For example, in some embodiments, the search of the slots 342 of the memory banks 341 can return an approximate location (e.g., row) for a particular element. For example, if the approximation search returns the approximate location as S (S representing a particular row within the memory banks 341), then the location of the element can be at S or S−1. That is, the approximation search can provide a result (e.g., row) that is one too high and/or too low. In some embodiments, a secondary corrective search can search all possible rows (e.g., row S, row S+1, and row S−1) for the element. For instance, if the approximation search returns an approximate location of S, then:

$$T \in A \Leftrightarrow T \in \{A[S\alpha h - \alpha h], A[S\alpha h - \alpha h + 1], \ldots, A[S\alpha h + \alpha h - 1]\}$$

where α is the memory bank, h is the elements per row, T is the element searched, and A is the logical array searched.

The above equation allows for the approximation of the location of a particular element. In another embodiment, the approximate location determined by the search can be the midpoint location of the element. For instance, the search of the of the slots 342 can find the row that is nearest the location of a particular element. In some embodiments, the memory bank search component can find multiple midpoint locations in a single search. For example, the memory bank search component can perform a search to locate a first midpoint and then perform a second search to locate a second midpoint. The memory bank search component can utilize the midpoint location to determine the actual location of the particular element in a corrective search.

In some embodiments, once the approximate locations (e.g., rows and/or slots) of the elements are determined, the memory bank search component can perform a corrective search on a memory bank (e.g., 341-1, 341-2, and/or 341-3) to determine the location of the particular element within the memory banks (e.g., 341-1, 341-2, and/or 341-3). The corrective search can search the potential location matches (e.g., rows of a memory bank) stored in the queue. For example, the memory bank search component can perform a corrective search by searching, in parallel, the rows (e.g., 344-1D, 344-2D, 344-3D, and/or 344-4D) of a memory bank (e.g., 341-1) identified in the search for the approximate location of elements. For instance, if the approximation search identifies slot 1 342-1A, row 344-1D of memory bank 341-1 and slot 1 342-1A, row 344-2D of memory bank 341-1, the memory bank search component can search slot 1 342-1A, row 344-1D of memory bank 341-1 and slot 1 342-1A, row 344-2D of memory bank 341-1 in parallel to perform a corrective search based on the information received during the approximation search.

In some embodiments, the memory bank search component can use an algorithm to perform the corrective search on the memory bank and search the rows 344 of a memory bank (e.g., 341-1, 341-2, or 341-3) in parallel. For example, the memory bank search component can use the following algorithm to perform the corrective search:

$$(k+1)\log_{2^n}\left(\frac{L(A)}{\alpha}\right) + 3 + k + d$$

$$\text{that can be simplified} = \frac{(k+1)\log\left(\frac{L(A)}{\alpha}\right)}{\log 2^n} + 3 + k + d$$

$$\text{that can be simplified} = \left(\frac{k+1}{n}\right)\log\left(\frac{L(A)}{\alpha}\right) + 3 + k + d$$

where k is the memory read latency, d is the additional pipeline stages, α is the number of memory banks and n is defined as the smallest value that satisfies $2^{(n+1)} - 2 \geq \alpha \geq 2^n - 1$ with a note that n>1.

The memory bank search component can determine the element with the lowest key stored in the queue during the corrective search and identify the corresponding data component. The memory bank search component can use the identified particular element to access the data component stored in the memory device. That is, the element with the lowest key can be used to determine the location of the data component in the memory sub-system.

In some embodiments, separating the slots 342 of the memory banks 341 into rows 344 can increase the storage capacity of each memory bank and the logical array, as compared to memory banks that are not divided into slots and/or separated into rows. For instance, each memory bank can store multiple elements in a slot due to the slot being separated into rows, thereby increasing the storage capacity of the memory bank. Increasing the storage capacity of each memory bank can reduce the elements searched to a single logical array (e.g., array 340). Further, increasing the storage capacity of the memory banks can also reduce the number of memory banks to be searched which can reduce the search time for the elements, as compared to a memory bank with a reduced storage capacity. Moreover, searching the rows 344 of a memory banks 341-1, 341-2, or 341-3 in parallel can increase the search speed of locating a particular element and/or two or more elements, as compared to searching the rows 344 individually (e.g., not in parallel).

Figure 4:
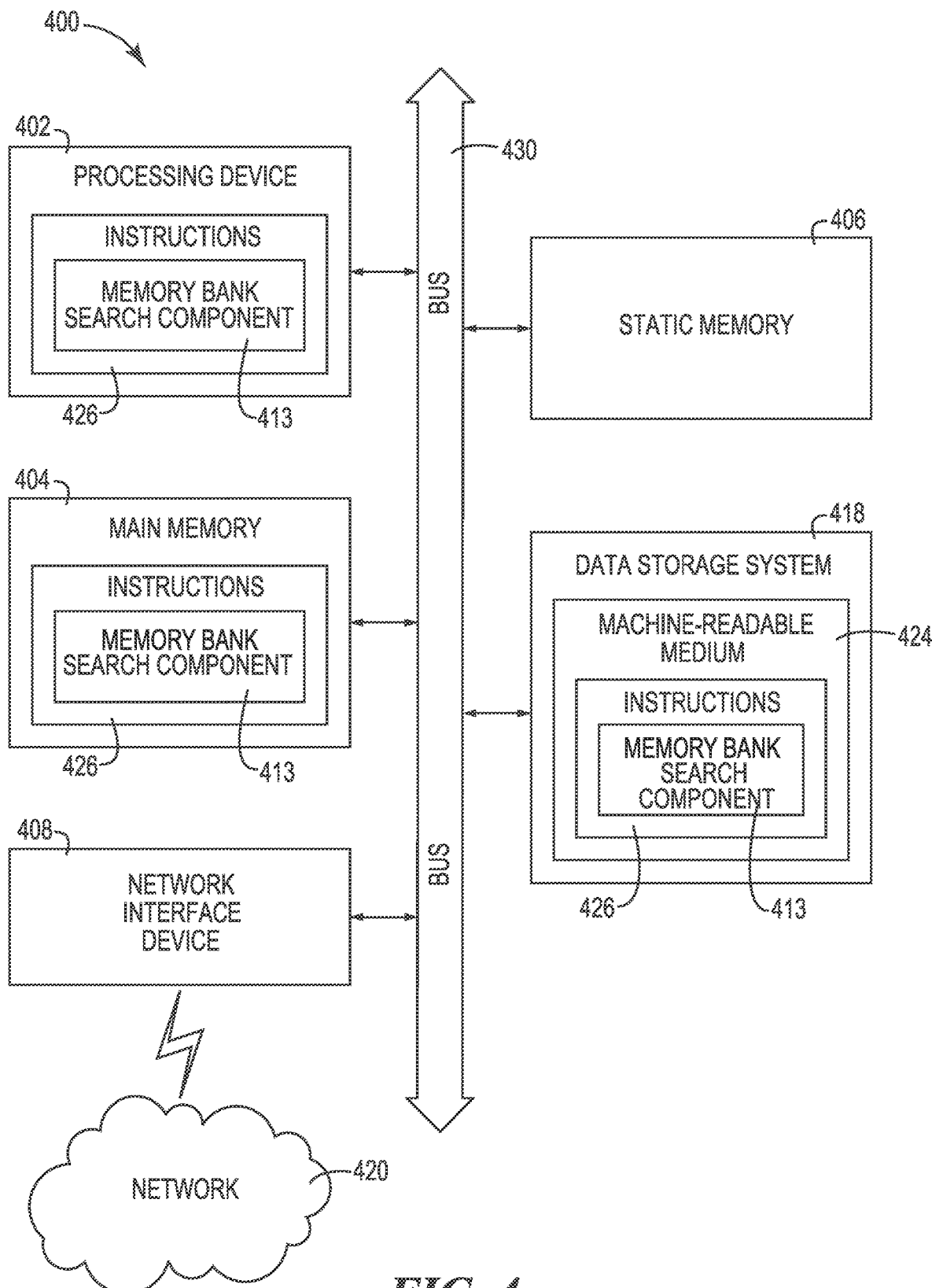
FIG. 4 is a block diagram of an example computer system in which embodiments of the present disclosure may operate.

FIG. 4 is a block diagram of an example computer system 400 in which embodiments of the present disclosure may operate. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory bank search component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or RDRAM, etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a memory bank search component 413 (e.g., the memory bank search component 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a memory component; and
a processing device, operatively coupled with the memory component, to:
construct a logical array having a plurality of memory banks that are separate from the memory component, wherein each of the plurality of memory banks is split into a plurality of slots, wherein each slot of the plurality of slots of each of the plurality of memory banks is separated into rows;
store, in the plurality of slots of each of the plurality of memory banks of the logical array, a plurality of elements corresponding to a plurality of data components stored in the memory component;
determine a location of a data component stored in the memory component by:
searching for elements stored in particular slots of the plurality of slots to determine which slots of the plurality of slots contain the elements;
performing a corrective search on the rows of the slots of the plurality of slots that contain the elements to locate a particular element by locating a lowest numbered key within the elements, wherein the particular element is associated with the lowest numbered key, wherein the lowest numbered key has a corresponding value and the corresponding value is stored within the element with the lowest numbered key; and
determining the location of the data component by using the stored corresponding value within the element with lowest numbered key; and
access the data component stored in the memory component based on the location.

2. The system of claim 1, wherein each of the plurality of memory banks is split into three or more slots.

3. The system of claim 1, wherein the processing device is further to:
store each respective element of the plurality of elements in a different row.

4. The system of claim 1, wherein the processing device is further to perform the corrective search by searching the rows of the slots of the plurality of slots that contain the elements in parallel to locate the particular element.

5. The system of claim 1, wherein each of the plurality of memory banks is associated with a single data port.

6. The system of claim 5, wherein the single data port associated with each of the plurality of memory banks comprises a random-access memory (RAM).

7. The system of claim 5, wherein the single data port associated with each of the plurality of memory banks is one of three or more data ports of the system.

8. A method, comprising:
constructing a logical array having a plurality of memory banks, wherein each of the plurality of memory banks is split into a plurality of slots;
separating each slot of the plurality of slots of each of the plurality of memory banks of the logical array into rows;
storing, in each row of the plurality of slots of each of the plurality of memory banks of the logical array, an element corresponding to a data component in a memory component of a memory sub-system, wherein the memory component is separate from the plurality of memory banks of the logical array;
determining two or more elements associated with a data component stored in the memory component by:
searching each of the plurality of slots for the two or more elements to determine which slots of the plurality of slots contain the two or more elements; and
performing a corrective search on the rows of the slots of the plurality of slots that contain the two or more elements by searching in parallel for a particular element of the two or more elements in the rows of the slots of the plurality of slots that contain the two or more elements by locating a lowest numbered key within the two or more elements, wherein the particular element is associated with the lowest numbered key, wherein the lowest numbered key has a corresponding value and the corresponding value is stored within the element with the lowest numbered key;
determining a location of a data component by using the stored corresponding value within the element with the lowest numbered key; and
accessing the data component stored in the memory component.

9. The method of claim 8, further comprising including a key and a corresponding value in each element stored in each row.

10. The method of claim 9, further comprising sorting each element stored in each row in ascending or descending order based on the key.

11. The method of claim 8, wherein performing the corrective search includes performing two or more sense operations on the memory banks.

12. The method of claim 8, further comprising determining a plurality of rows to approximate the particular element.

13. A non-transitory computer-readable storage medium comprising instructions that, when executed by a processing device, cause the processing device to:
construct a logical array having a plurality of memory banks, wherein each of the plurality of memory banks is split into a plurality of slots and is associated with a single data port, wherein each slot of the plurality of slots of each of the plurality of memory banks is separated into rows;
store, in each slot of the plurality of memory banks of the logical array, a different element, wherein each different element corresponds to a different data component stored in a memory component of a memory sub-system, wherein the memory component is separate from the plurality of memory banks of the logical array;
determine a particular element associated with a particular data component stored in the memory component by:
searching for two or more elements in particular slots of the plurality of slots to determine which slots of the plurality of slots contain the two or more elements; and
performing a corrective search on the rows of the slots of the plurality of slots that contain the two or more elements by searching, in parallel, each slot of the plurality of slots containing the two or more elements to locate the particular element associated with the particular data component stored in the memory component by locating a lowest numbered key within the two or more elements, wherein the particular element is associated with the lowest numbered key, wherein the lowest numbered key has a corresponding value and the corresponding value is stored within the element with the lowest numbered key;

determine a location of the particular data component by using the stored corresponding value within the element with the lowest numbered key; and access the particular data component stored in the memory component.

14. The non-transitory computer-readable storage medium of claim 13, wherein the processing device is further to perform the corrective search by performing two or more sense operations on the slots containing the two or more elements to locate the particular data component.

15. The non-transitory computer-readable storage medium of claim 13, wherein the processing device is further to locate the particular element in one of the plurality of memory banks by processing each memory bank of the plurality of memory banks concurrently.

16. The non-transitory computer-readable storage medium of claim 13, wherein each different element includes a key and a corresponding value.

17. The non-transitory computer-readable storage medium of claim 16, wherein the processing device is further to:

store the elements in the rows in ascending order of the key.

* * * * *